United States Patent
Krozer et al.

(10) Patent No.: US 8,624,584 B2
(45) Date of Patent: Jan. 7, 2014

(54) METHOD AND ARRANGEMENT RELATING TO ANALYSES OF A SUBSTANCE

(75) Inventors: Anatol Krozer, Goteborg (SE); Christer Johansson, Goteborg (SE); Jakob Blomgren, Kungalv (SE); Karolina Petersson, Stockholm (SE); Dag Ilver, Kallered (SE); Andrea Prieto Astalan, Onsala (SE); Christian Jonasson, Göteborg (SE)

(73) Assignee: Acreo Swedish ICT AB, Kist (SE)

( * ) Notice: Subject to any disclaimer, the term of this patent is extended or adjusted under 35 U.S.C. 154(b) by 1016 days.

(21) Appl. No.: 12/254,288

(22) Filed: Oct. 20, 2008

(65) Prior Publication Data

US 2009/0085557 A1   Apr. 2, 2009

Related U.S. Application Data

(63) Continuation of application No. PCT/SE2007/000314, filed on Apr. 4, 2007.

(30) Foreign Application Priority Data

Apr. 19, 2006  (SE) .................................... 0600870

(51) Int. Cl.
G01N 27/74  (2006.01)
(52) U.S. Cl.
USPC ........................................... 324/204; 436/526
(58) Field of Classification Search
USPC ........................................... 324/204; 436/526
See application file for complete search history.

(56) References Cited

U.S. PATENT DOCUMENTS

| 6,027,946 A | 2/2000 | Weitschies et al. |
| 2003/0076087 A1* | 4/2003 | Minchole et al. ............. 324/204 |
| 2004/0235197 A1* | 11/2004 | Kotitz et al. .................. 436/526 |
| 2008/0284413 A1* | 11/2008 | Tsukamoto et al. .......... 324/204 |

FOREIGN PATENT DOCUMENTS

| DE | 0111360 | 2/2001 |
| DE | 19938384 | 2/2001 |
| JP | 10-513551 A | 12/1998 |
| JP | 2005-527782 * | 9/2005 |
| WO | 9623227 A1 | 8/1996 |
| WO | 2005111596 A1 | 11/2005 |
| WO | 03019188 | 3/2006 |

OTHER PUBLICATIONS

Astalan et al., "Biomolecular reactions studied using changes in Brownian rotation dynamics of magnetic particles" Biosensors & Bioelectronics, 19 (2004) pp. 945-951.

(Continued)

*Primary Examiner* — Jay Patidar
(74) *Attorney, Agent, or Firm* — Gesmer Updegrove LLP

(57) ABSTRACT

A device for detecting a magnetic field response or changes in a magnetic response of at least one magnetic particle in a carrier fluid, the detection comprising measuring the magnetic particles characteristic rotation period, and the measurement involving measurement of a Brownian relaxation in the carrier fluid under influence of an external pulsed magnetic field. The device includes means for generating the pulsed magnetic field, at least two substantially identical detection coils connected in gradiometer coupling to detection electronics for measuring the differential induced voltage which is dependent on the frequency dependent susceptibility or the magnetization change.

16 Claims, 8 Drawing Sheets

(56) References Cited

OTHER PUBLICATIONS

Figure 1:
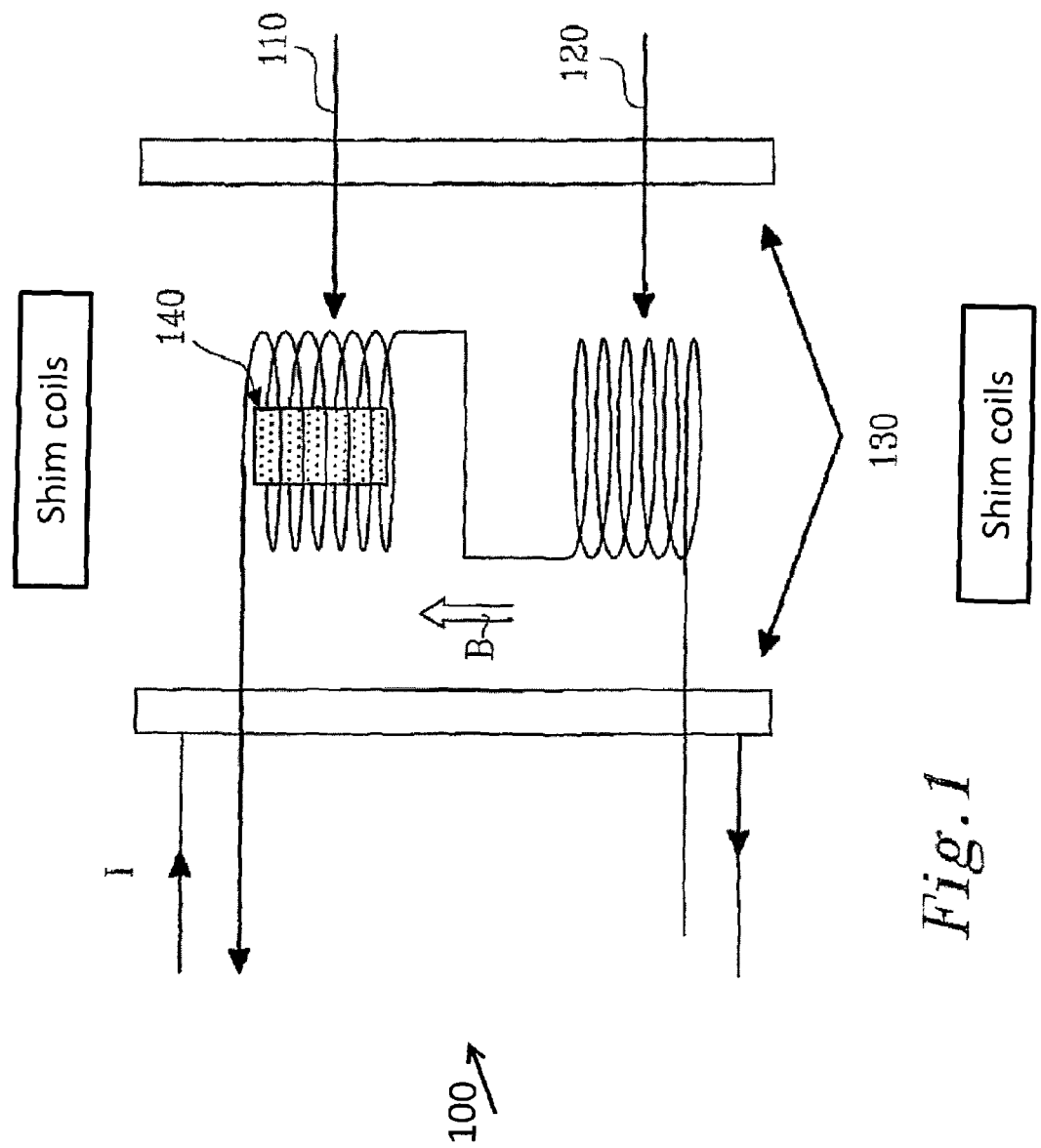

Koititz et al., "Determination of the binding reaction between avidin and biotin by relaxation measurements of magnetic particles" Journal of Magnetism and Magnetic Materials 194 (1999) pp. 62-68.

Connolly et al., "Proposed biosensors based on time-dependent properties of magnetic fluids" Journal of Magnetism and Magnetic Materials 225 (2001) pp. 156-160.

Supplementary European Search Report issued in connection with the corresponding EP Application No. 07747980, mailed on Dec. 13, 2011.

Petersson et al., "Brownian motion of aggregating nanoarticles studied by photon correlation spectroscopy measurements of dynamic magnetic properties," Analytica Chimica Acta, Elsevier, Amsterdam, NL, vol. 573-574, Mar. 22, 2006, pp. 133-146.

Japanese Office Action issued in connection with corresponding JP Application No. 2009-506441 mailed on Aug. 14, 2012, and English translation thereof.

JP Office Action and English translation thereof issued in connection with the corresponding JP Application No. JP2009-506441, mailed on Sep. 30, 2013.

\* cited by examiner

METHOD AND ARRANGEMENT RELATING TO ANALYSES OF A SUBSTANCE

PRIORITY INFORMATION

This application is a continuation of International Application Serial No. PCT/SE2007/000314 filed on Apr. 4, 2007 which claims priority to Swedish Application No. 0600870-0 filed Apr. 19, 2006, both of which are incorporated herein by reference in their entirety.

TECHNICAL FIELD OF THE INVENTION

Detection of Brownian relaxation times by measuring the dynamic magnetic susceptibility (sinus excitation) and the magnetic relaxation (pulsed excitation)

BACKGROUND OF THE INVENTION

Brownian relaxation of a magnetic particle system with thermally blocked magnetic single domains (in the particles) can be detected by sweeping the frequency of the measuring field and measure the magnetic response, i.e. the real and imaginary part of the magnetic response, see for example WO 03/019188, by the same applicant and incorporated herein by reference. At the characteristic Brownian relaxation frequency the real part of the magnetic response decreases and the imaginary part exhibit a maximum. From the frequency dependent magnetic response the Brownian relaxation frequency can be determined. This method may be sensitive since it is possible to use the sensitivity of the lock-in amplifier technique in order to detect the magnetic response from the detection coil system placed in (the centre of) an excitation coil. The sensitivity of this technique can be further increased by tuning the resonance of the detection coil by an external capacitor in such way that the measurement at each excitation frequency is made at the peak value of the response of the detection coils. However, this technique requires that the frequency is swept over the Brownian relaxation frequency peak. This technique is described below.

Moreover, the detection in the frequency domain is usually relatively slow and requires changes of the sample position from one detection coil to another.

SUMMARY OF THE INVENTION

The invention uses a particular mode of the detection in the time domain. The excitation field is pulsed and then the decay (change) of magnetisation of the sample with time is monitored by monitoring the decay of the voltage in the detection coil.

One object of the present invention is to measure small magnetic signals from samples with low magnetic content or low magnetic properties. Another object of the present invention is to measure the increase of the magnetisation of the sample when the field is applied and the decrease of magnetisation when the field is turned off. Yet another object of the invention is to eliminate frequency sweep of a measuring field.

An important advantage of the sample response measurements according to the invention is its speed; the measurements are much faster than the previously described technique based on the sweeping of the frequency of the excitation field.

These and other objects and advantages, further described in the following description, are achieved by means of a method for detecting changes of a magnetic response of at least one magnetic particle in a carrier fluid, the method comprising: using a measuring procedure comprising measuring the characteristic rotation time of the magnetic particle, the measuring procedure further involving measuring Brownian relaxation in the carrier fluid under influence of an external pulsed excitation magnetic field, and based on the influence of the external pulsed excitation magnetic field measuring a hydrodynamic volume of a particle or a change in a hydrodynamic volume of the particle change upon modification of an effective volume of the particle or its interaction with the carrier fluid by detecting change of magnetisation of the particle with time by monitoring change of an output signal in a detection coil. Preferably, the detection coil system detects a differential induced voltage which is dependent on change of a magnetic flux over a period.

Accordingly, The differential induced voltage from well balanced detection coil system is:

$$\Delta V = N\frac{d}{dt}(\Phi_1 - \Phi_2) = \mu_0 NA\alpha \frac{d}{dt}(H + M - H) = \mu_0 NA\alpha \frac{d}{dt}M$$

wherein N is a number of turns in two identical detection coils, A is the cross sectional area in the detection coils, H the magnetic field produced by the excitation coil, $\alpha$ a magnetic coupling factor and M is a magnetization of the particle system. Thus, a dynamic susceptibility for a magnetic particle system with a Brownian relaxation time is provided by (not exclusively):

$$\chi = \int \frac{\chi_0}{(1 + j\omega \tau_B(r_H))} f(r_H) dr_H \quad [1]$$
$$= \chi_0 \int \frac{1}{(1 + j\omega \tau_B(r_H))} f(r_H) dr_H$$

where $\chi_0$ is a DC susceptibility, a the angular frequency ($2\pi f$), $r_H$ a hydrodynamic radius of particles, $f(r_H)$ is a hydrodynamic radius distribution function and $\tau_B$ is the Brownian relaxation time according to:

$$\tau_B = \frac{3V_H \eta}{k_B T} = \frac{4\pi r_H^3 \eta}{k_B T}$$

where $V_H$ is the hydrodynamic volume, $\eta$ viscosity of the fluid in which the magnetic particles are placed in, $k_B$ Boltzmann constant and T is the temperature. Preferably, approximation depends on magnetic particles containing a number of magnetic single domains and a total magnetic moment is a vector sum of the individual magnetic moments from each of the single domains. A hydrodynamic size distribution of the magnetic particle system is determined using mentioned model or any other similar models.

The method may further comprise absorption of molecules on a surface of particles whereby the hydrodynamic radius of the particles increases, and when the surface is saturated with molecules, a hydrodynamic volume have increased by a shell that has a thickness surrounding the original particle, and that the hydrodynamic radius increase is linear to the coverage.

Preferably, the Brownian relaxation time after molecule absorption is expressed as:

$$\tau_B = \frac{4\pi(r_H + \delta)^3 \eta}{k_B T}$$

where $r_H$ is the initial hydrodynamic radius before the particle surface became covered with molecules. A new dynamic susceptibility is expressed as:

$$\chi = \chi_0 \int \frac{1}{(1 + j\omega\tau_B(r_H, \theta))} f(r_H) dr_H$$

whereby the Brownian relaxation time is also dependent on a coating, which is dependent on an analyte concentration.

Preferably, the particle is provided with an external layer.

The invention also relates to a device for detecting a magnetic field response or changes in a magnetic response of at least one magnetic particle in a carrier fluid. The detection comprises measuring the magnetic particles characteristic rotation period, and the measurement involving measurement of a Brownian relaxation in the carrier fluid under influence of an external pulsed magnetic field. The device comprises means for generating the pulsed magnetic field, at least two substantially identical detection coils connected in gradiometer coupling and means for connecting to detection electronics for measuring the frequency. The device further comprises a detection coil system comprising a first detection coil and a second detection coil, an excitation coil and a sample holder, wherein a voltage difference is dependent on the detection coils' number of turns or physical characteristics. Preferably, the excitation coil is wound as a solenoid with a specific length, diameter and number of turns of the winding. The excitation coil produces an excitation field (H) and has an effect on the signal response as:

$$\Delta V = N \frac{d}{dt}(\Phi_1 - \Phi_2) = \mu_0 N A \alpha \frac{d}{dt}(H + M - H) = \mu_0 N A \alpha \frac{d}{dt} M$$

The device may further comprise extra shim coils at top and bottom of the solenoid in order to generate a more homogenous magnetic field in the excitation coil. The detection coil system may be arranged in a form of a first order gradiometer coupling placed in the center of the excitation coil. According to another embodiment the detection coil system is arranged as two well matched coils coupled together. The detection coil system is arranged to detect a rate of a magnetic flux difference between the two coils.

Preferably, the detection coil system is formed by positioning two matched coils with their length axis substantially parallel to a length axis of the excitation coil. Preferably, the two detection coils have a specific length, diameter and a number of turns of the wirings and the excitation coils gives a signal strength from the detection coil system. According to an advantageous embodiment, the detection coils are wounded in two different directions, i.e. clockwise and counterclockwise and coupled in series or the detection coils are wounded in the same directions but coupled together so that the induced voltages in the two coils are in the opposite direction.

Preferably, a magnetic signal is measured first from a measurement with a sample in one of the coils and then another measurement of the sample in the other coil. A total voltage detected when the sample is in the first coil is $V_1 + V_{background}$ and the total voltage detected when the sample is in the second coil is $-V_2 + V_{background}$, and a difference of the two measurements results in $V_1 + V_2$ which eliminates a background noise and the mean value of $V_1 + V_2$ represents a signal from the sample.

Most preferably, an external pulsed magnetic field is applied over the same particle system, and a magnetization of the particles is measured in time domain either by measuring the increase of magnetisation immediately after application of a pulse or by measuring the decay of magnetisation after the pulse has been switched off.

A pulsed magnetic field may be applied over the same particle system, and a magnetization of the particles increases when the field is applied and decrease exponentially when the field is removed; where the exponential behaviour is characteristic of relaxation time which is proportional to the inverse of the Brownian relaxation frequency.

In one embodiment, the frequency of a measuring field is not swept but same information is obtained by performing a Fourier transformation of the relaxation of the magnetic response in the time domain.

The information is a frequency dependent magnetic response.

Preferably, the hydrodynamic size distribution of the magnetic particle system is determined by measuring the induced voltage, both when the field is on and when the field is switched off. Preferably, a duty cycle of the pulse train (a/T) is chosen so that an exponential increase of the magnetization, when the field is on, and an exponential decay of the magnetization, when the field is switched off, is fully detected in the detection time window. The device may comprise a tunable capacitance coupled in parallel to a capacitance of the system and a resonant frequency of each coil is adjusted to a measuring frequency.

The device according to one embodiment may comprise a capillary as a sample holder and a fluidic flow system to deliver the sample to a detection area. Accordingly, the sample is injected into a flow as an assembly having a width that is determined by an injection time and speed. The device may further comprise means for regulating the flow so that the assembly can be stopped at a desired position, such as at a measuring position.

The device may also have means for using several assemblies of the same or different materials created by successive injections.

The invention also relates to a method of calibrating a previously mentioned system. The method comprises: a first step of measuring the system response with an empty sample holder, a second step of computing difference in signal when the empty sample holder is in the first coil to when the sample holder is in the second coil, a third step of measuring the system with a sample containing a material with a known and preferably frequency independent magnetic susceptibility; and calibrating the system based on the measurements. In the first step the difference is attributed to the dielectric properties of the sample holder and the mechanical arm moving the sample holder. The resulting (complex) voltage, $V_b = V_b^{Re} + j*V_b^{Im}$, is a background signal which is subtracted from any measured signal in the subsequent measurements. In the third step, the material is a paramagnetic material. The calibration materials are chosen to have a frequency independent susceptibility in the frequency range that is used the system. The value of the susceptibility of the calibration material is in the same range as for the measured sample. The geometry and dimensions of the calibration sample is in the same as for the measurement samples, in order to get the correct coupling factor in the detection coil.

SHORT DESCRIPTION OF THE DRAWINGS

Figure 2:
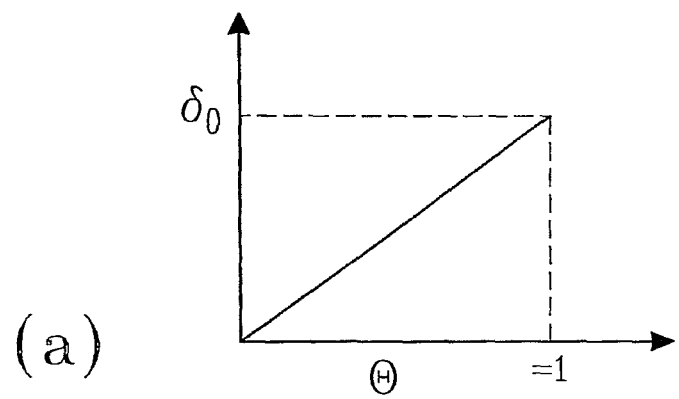
Figure 2:
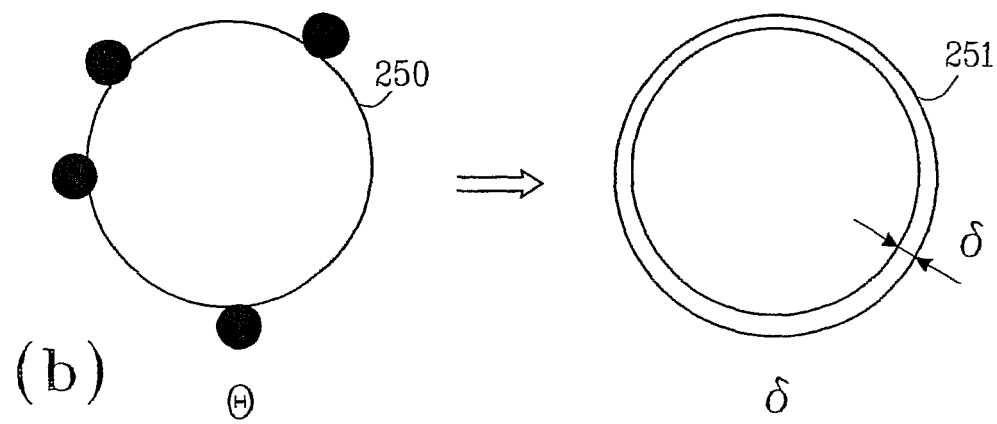
Figure 3:
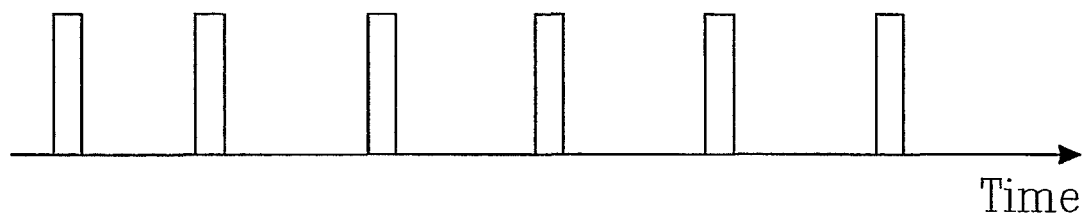
Figure 4:
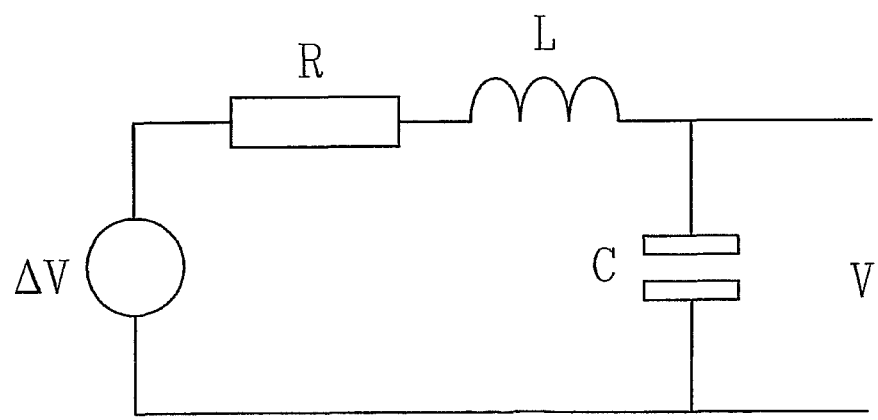
Figure 5:
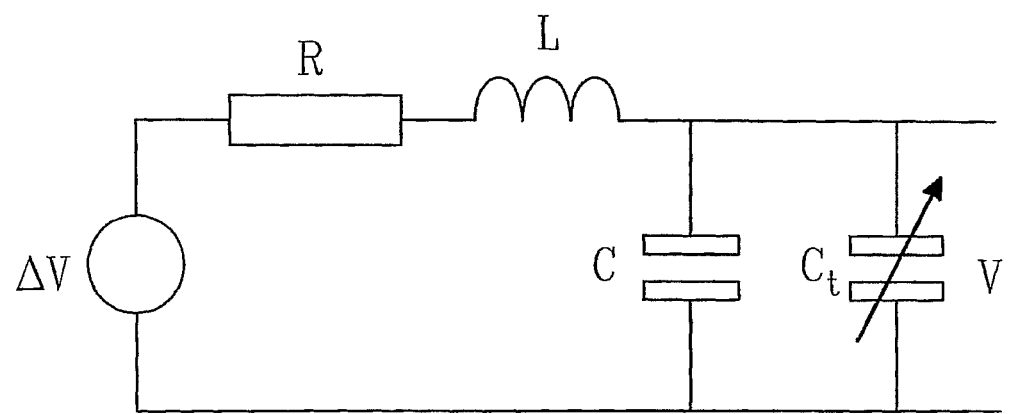
Figure 6:
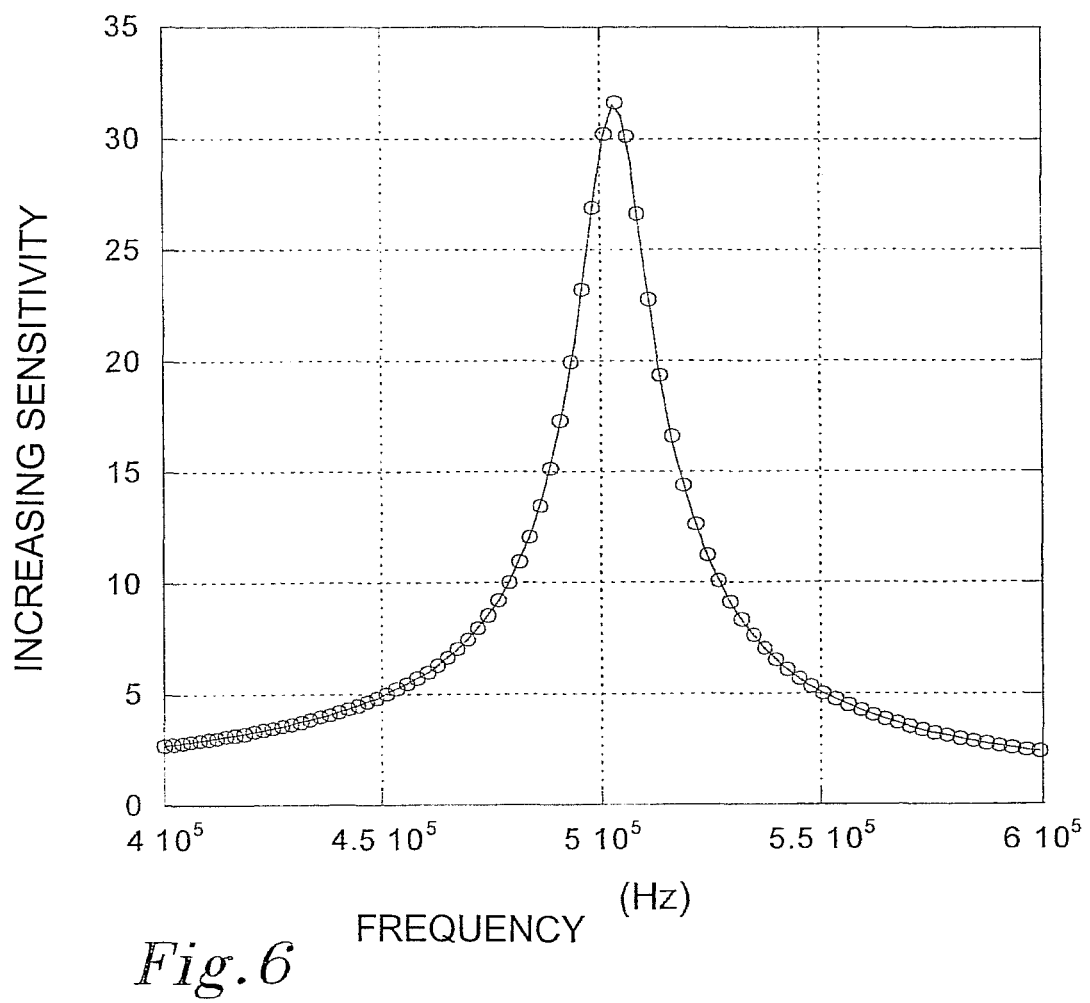
Figure 7:
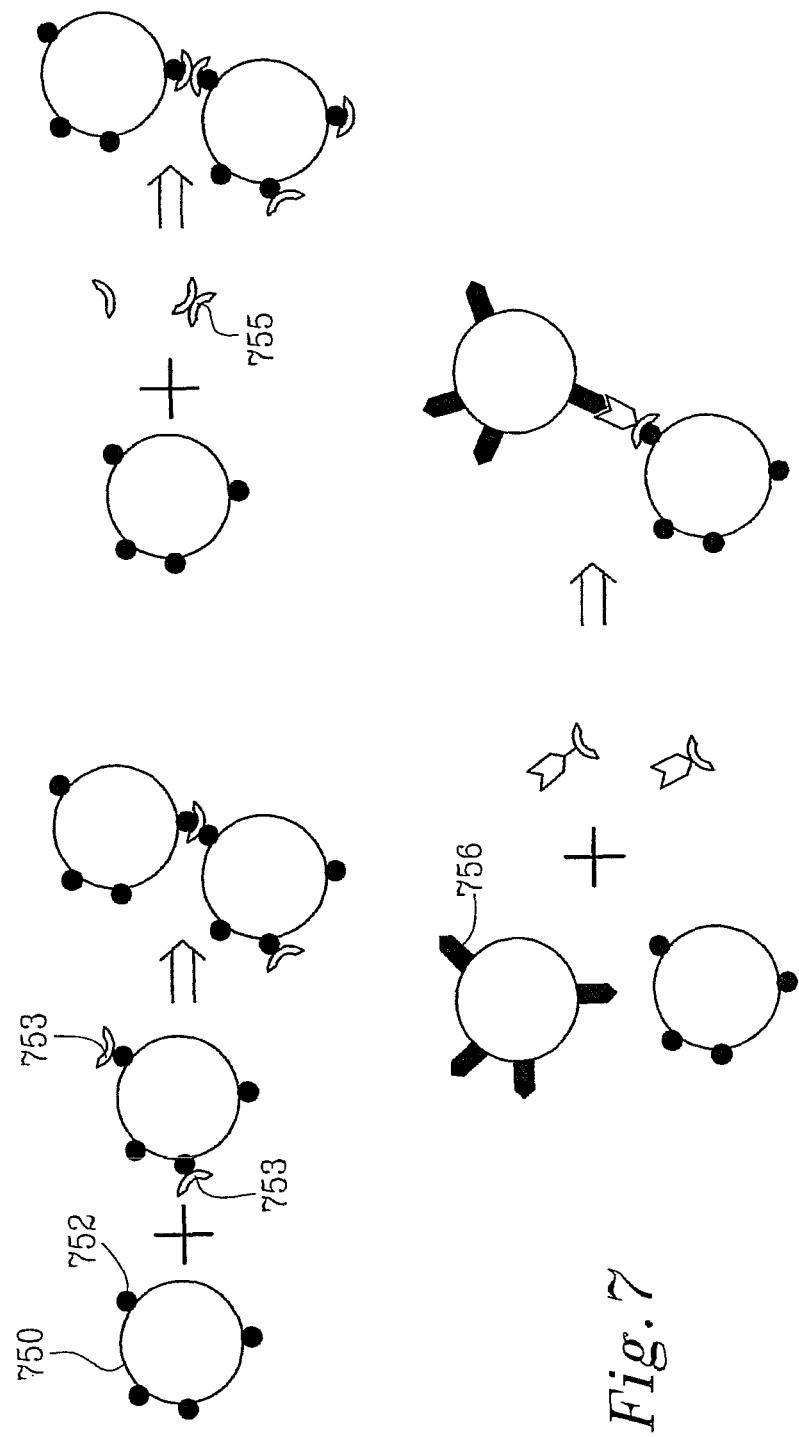
Figure 8:
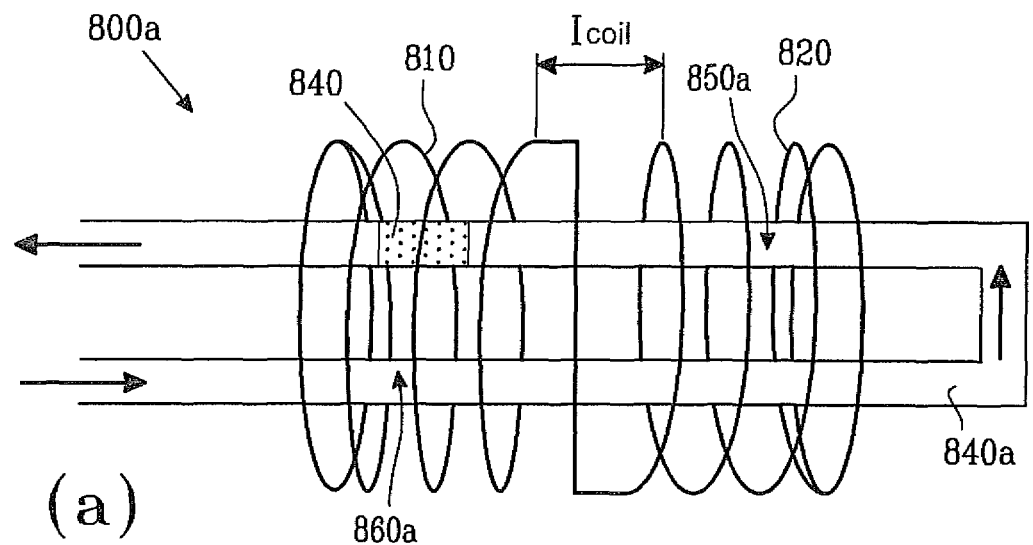
Figure 8:
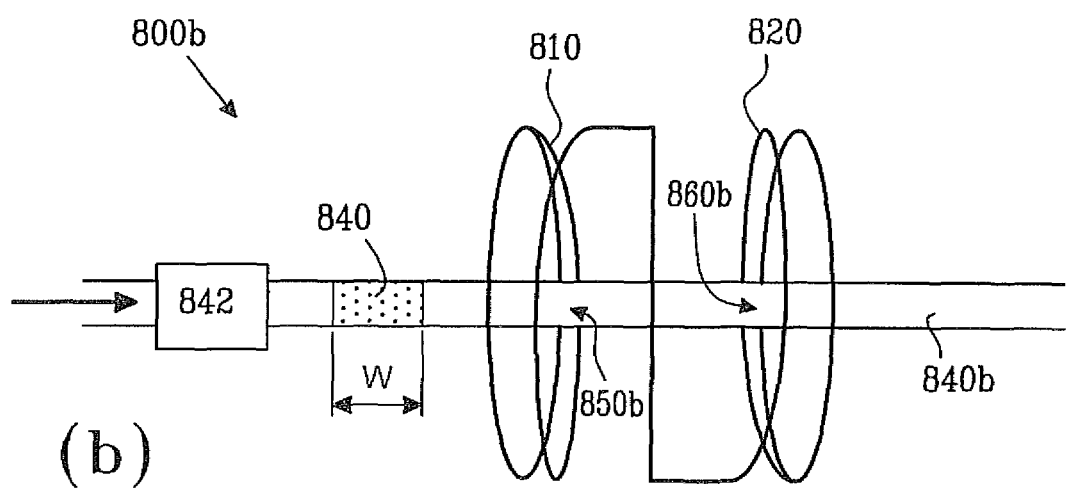
Figure 9:
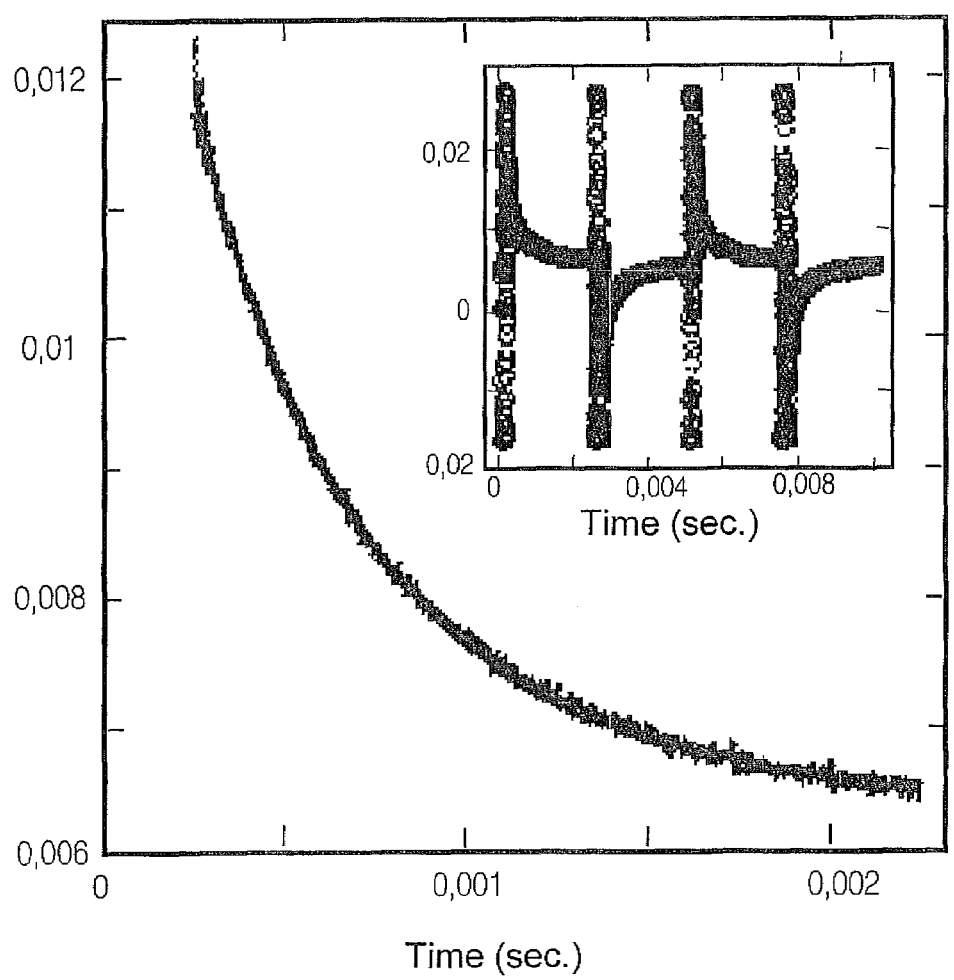

In the following, the invention will be described with reference to enclosed non-limiting exemplary drawings, in which:

FIG. 1 is a cross section of a schematic coil system according to one embodiment of the invention, FIGS. 2a-2b is a graph over the hydrodynamic radius increase versus particle surface coverage and an exemplary particle, FIG. 3 is an example of pulse trains for the excitation field, FIG. 4 is a typical circuit representation for the induction coil (LHS circuit), FIG. 5 is an equivalent circuit for the detection coil with a tunable external capacitance, FIG. 6 illustrates typical increase of the detection voltage when the detection takes place close to or at the coil resonance, and FIG. 7 is schematics of typical situations when clustering takes place, FIGS. 8a and b is schematic illustration of embodiments according to the invention, and FIG. 9 is a detection window image according to the present invention.

DETAILED DESCRIPTION OF THE EMBODIMENTS

According to the invention, a detection coil system detects the differential induced voltage which is dependent on the change of the magnetic flux over a period.

The differential induced voltage from the well balanced detection coil system can be expressed as:

$$\Delta V = N \frac{d}{dt}(\Phi_1 - \Phi_2) \quad [1]$$
$$= \mu_0 N A \alpha \frac{d}{dt}(H + M - H)$$
$$= \mu_0 N A \alpha \frac{d}{dt} M$$

where N is the number of turns in the two identical detection coils (that is forming the detection coil system described below), A is the cross sectional area in the detection coils, H the magnetic field produced by the excitation coil, α a magnetic coupling factor which depends on the geometry and dimensions of the sample with respect to the detection coil dimensions and M is the magnetization of the particle system. The coupling factor α is usually determined from calibration of the induction coil system with a substance with 1) a known well defined susceptibility and 2) the same dimensions of the calibration sample as for the measured sample. This equation is the same for both an excitation field with a sinus field or a pulsed magnetic field. For the sinus field the magnetization can be expressed by:

$$M = \omega^* H = (\chi' - j\chi'')H \quad [2]$$

where $\chi'$ is the real part and $\chi''$ is the imaginary part of the dynamic magnetic susceptibility. Thus, in this case the amplitude of the differential induced voltage from the detection coils becomes:

$$\Delta V = \mu_0 N A \alpha (\chi' - j\chi'') j\omega H_0 = \mu_0 N A \omega H_0 \alpha (\chi'' + j\chi') \quad [3]$$

where $H_0$ is the amplitude of the magnetic field. By using this equation, the real and imaginary part of the frequency dependent susceptibility can de determined and thereby determine how the Brownian relaxation time is changing when chemical reactions on the magnetic particles takes place. This is described in above mentioned WO 03/019188.

In order to model the dynamic susceptibility for the magnetic particle system with a distribution of Brownian relaxation times (due to a distribution of hydrodynamic sizes of the particles), the Debye model is integrated over the size distribution according to:

$$\chi = \int \frac{\chi_0}{(1 + j\omega\tau_B(r_H))} f(r_H) dr_H \quad [4]$$
$$= \chi_0 \int \frac{1}{(1 + j\omega\tau_B(r_H))} f(r_H) dr_H$$

where $\chi_0$ is the DC susceptibility, $\omega$ the angular frequency ($2\pi f$), $r_H$ the hydrodynamic radius of the particles, $f(r_H)$ is the hydrodynamic radius distribution function (where the lognormal distribution can be used) and $\tau_B$ is the Brownian relaxation time according to:

$$\tau_B = \frac{3V_H \eta}{k_B T} = \frac{4\pi r_H^3 \eta}{k_B T} \quad [5]$$

where $V_H$ is the hydrodynamic volume, $\eta$ the viscosity of the liquid the magnetic particles are placed in, $k_B$ the Boltzmann constant and T is the temperature. The last step in equation [4] is valid, provided that the DC susceptibility is independent on the hydrodynamic volume of the particles. This approximation can be used since magnetic particles contain a large number of magnetic single domains and the total magnetic moment is the vector sum of the individual magnetic moments from each of the single domains. Numerous tests have shown that this approximation gives results which are comparable to, or better than, other methods determining the hydrodynamic size. By fitting experimental data of the dynamic susceptibility to the above described model, equation [4], it is possible to determine the hydrodynamic size distribution of the magnetic particle system.

When absorption of molecules on the surface of the particles takes place the situation can be pictured as that the hydrodynamic radius of the particles increases. It is possible to define particle surface coverage, θ, where θ=1 means that the entire surface of the particle is covered with molecules. When the surface is saturated with molecules it is possible to define that the hydrodynamic volume have increased by a shell 251 (FIG. 2b) that has a thickness=$\delta_0$, surrounding the original particle 250, and that the hydrodynamic radius increase is linear to the coverage, see FIG. 2a.

The number of analyte molecules that can be absorbed by a particle with a specific hydrodynamic radius is approximated by:

$$N_{analyt\_partikel}(r_H) = N_{analyt} \frac{N_{ptot} f(r_H) dr_H 4\pi r_H^2}{\int N_{ptot} f(r_H) 4\pi r_H^2 dr_H} \quad [6]$$

where $N_{analyt}$ is the total number of molecules and $N_{ptot}$ is the total number of particles in the liquid. The maximum number of molecules that can be absorbed on a particle with a specific hydrodynamic radius is:

$$N_{analyt\_partikel\_max}(r_H) = n N_{ptot} f(r_H) dr 4\pi r_H^2 \quad [7]$$

where n is the number of molecules per unit particle surface area. The coverage can then be expressed as:

$$\theta = kN_{analyt\_partikel} \quad [8]$$

$$= \frac{N_{analyt\_partikel}(r_H)}{N_{analyt\_partikel\_max}(r_H)}$$

$$= \frac{N_{analyt}}{\int nN_{ptot}f(r_H)4\pi r_H^2 dr_H}$$

Thus, the coverage of a particle is independent on the hydrodynamic radius; however, the actual number of absorbed molecules is dependent of the hydrodynamic radius, equation 6.

The Brownian relaxation time after molecule absorption can be expressed as:

$$\tau_B = \frac{4\pi(r_H + \delta)^3 \eta}{k_B T} \quad [9]$$

where $r_H$ is the initial hydrodynamic radius before the particle surface became covered with molecules. The new dynamic susceptibility can then be expressed as:

$$\chi = \chi_0 \int \frac{1}{(1 + j\omega\tau_B(r_H, \theta))} f(r_H) dr_H \quad [10]$$

whereby the Brownian relaxation time is also dependent on the coverage, which is dependent on the analyte concentration.

A preferred detection coil system 100 is illustrated schematically in FIG. 1. The system comprises 1 first detection coil 110 and a second detection coil 120, an excitation coil 130 and a sample holder 140. The detection coils have a number of (N) turns so arranged that they produce a voltage difference. Other physical characteristics, such as diameter, size etc. may also be used to produce a voltage difference. A current I passes through the excitation coil 130.

The excitation coil 130 is wound as an ordinary solenoid with a specific length, diameter and number of turns of the winding. The excitation coil produces the excitation field, H, and have the effect on the signal response as described in eq. 1-eq. 3. The number of turns of the windings per unit length of the solenoid and the current in the excitation coil produces the excitation field. Extra shim coils may be placed at the top and the bottom of the solenoid in order to generate a more homogenous magnetic field in the excitation coil, see for instance "Modelling the Static Fringe Field of Superconducting Magnets" by P. Jeglic, et al, J. Stefan Institute, University of Ljubljana, Jamova 39, Ljubljana, SI-1000, Slovenia. This document discloses that the resonance frequency-space and the frequency gradient-space relations are evaluated analytically for the static fringe magnetic field of superconducting magnets used in the NMR diffusion measurements. The model takes into account the actual design of the high-homogeneity magnet coil system that consists of the main coil and the cryoshim coils and enables a precise calibration of the on-axis magnetic field gradient and the resonance frequency inside and outside of the superconducting coil. The use of shim coils allows the excitation coil to be considerably shorter than an excitation coil built from only one solenoid.

The detection coil system 110, 120 in a form of a first order gradiometer coupling is placed in the center of the excitation coil. The detection coil system can also be viewed as two well matched coils coupled together. The detection coil system detects the rate of the magnetic flux difference between the two coils. The detection coil system is formed by positioning two well matched coils with their length axis (substantially) parallel to the length axis of the excitation coil. The two detection coils have a specific length, diameter and a number of turns of the wirings. The design of the excitation coils gives the signal strength from the detection coil system according to eq. 1-eq. 3. The detection coils can either be wounded in two different directions (clockwise and counterclockwise) or coupled in series, or the coils may be wounded in the same directions but coupled together so that the induced voltages in the two coils are in the opposite direction. Preferably, the detection coils should not be placed to close (typically not within the distance of the diameter of the detection coil) to each other so that they interact with each other. On the other hand the detection coils should not be distanced so that the length of the excitation coil becomes too large.

Even though the two detection coils are well matched there always may be some small differences. Thus, there will be an unbalance in the detection coil which results in a signal $V_{background}$ even when no sample is present in any of the coils. There will also be a difference in the signal $V_1$ induced by the sample when it is inside the first detection coil (the first loop of the gradiometer) and the signal $-V_2$ will be induced when the sample is in the second coil (the second loop of the gradiometer). In order to measure small magnetic signals from samples with low magnetic content or low magnetic properties, the small variations of the two coils must be considered. It is done by measuring the magnetic signal first from a measurement with the sample in one of the coils and then another measurement of the sample in the other coil. The total voltage detected when the sample is in the first coil is $V_1+V_{background}$ and the total voltage detected when the sample is in the second coil is $-V_2+V_{background}$. Taking the difference of the two measurements results in $V_1+V_2$ which eliminates the background and the mean value of $V_1+V_2$ represents the signal from the sample.

When a pulsed magnetic field is applied over the same particle system, the magnetization of the particles will increase when the field is applied and decrease exponentially when the field is off where the exponential behaviour is characteristic of relaxation time which is proportional to the inverse of the Brownian relaxation frequency (described above). In this case the frequency of a measuring field does not need to be swept; instead the same information, e.g. the frequency dependent magnetic response, is obtained by performing a Fourier transformation of the relaxation of the magnetic response in the time domain. The main, and most important, advantage of the sample response measurements to pulsed magnetic excitation fields is its speed;—the measurements are much faster than the previously described technique based on the sweeping of the frequency of the excitation field. The speed advantage increases with particle size. For large particles, the changes in the magnetic dynamic susceptibility occur at low frequencies, which necessitate long measurement times to achieve similar signal to noise ratios (SNRs) as the ones achieved for smaller particles. Fast measurement procedure opens a possibility for other measurement modes. One example is where one determines the kinetics of particle agglomerations as a measure of the changes in hydrodynamic volume, will be described in some detail below.

Another advantage is that there is no need to move the sample up and down between two coils. By dispensing with sample movement the whole system becomes much smaller, handier and cheaper. Moreover, it is also possible to determine the relaxation time distributions and the hydrodynamic properties of particle suspension as described above. To obtain the dynamic magnetic susceptibilities the sample must be moved between the two coils.

The signal sensitivity when using time domain measurements is less than the frequency sweep method (described above) which is the price one has to pay for the faster measurements compared to the measurements in the frequency domain. The distribution of Brownian relaxation times can also be determined from the time domain measurements since the experimental data in the time domain can be fitted to a distribution of exponential decay, as described below.

When pulsed magnetic field is used, the magnetization of a magnetic particle system with a distribution of Brownian relaxation times due to a distribution of hydrodynamic volumes of the particle system the magnetization can be expressed as:

$$M_{on} = \int M_0 \left(1 - e^{\frac{t}{\tau_B(r_H)}}\right) f(r_H) dr_H \quad [11]$$

$$= M_0 \int \left(1 - e^{\frac{t}{\tau_B(r_H)}}\right) f(r_H) dr_H$$

$$= \chi_0 H \int \left(1 - e^{\frac{t}{\tau_B(r_H)}}\right) f(r_H) dr_H$$

when the field is applied where t is the time after the field is applied, and:

$$M_{off} = \int M(0) e^{\frac{t}{\tau_B(r_H)}} f(r_H) dr_H \quad [12]$$

$$= M(0) \int e^{\frac{t}{\tau_B(r_H)}} f(r_H) dr_H =$$

when the field is switched off and the time t is now the time after the field is switched off and M(0) is the magnetization of the sample when the field is switched off. In equations 11 and 12, it is assumed (as done before in the frequency sweep method) that the total magnetic moment of the particles is independent of the hydrodynamic size of the particles.

The differential induced voltage in the case of pulsed magnetic field can then be expressed as (with the help of equation 1):

$$\Delta V_{on} = \mu_0 N A \alpha \frac{d}{dt} M_{on} \quad [13]$$

$$= \mu_0 N A \chi_0 H \alpha \int \frac{1}{\tau_B(r_H)} e^{\frac{t}{\tau_B(r_H)}} f(r_H) dr_H$$

when the field is on and:

$$\Delta V_{off} = \mu_0 N A \frac{d}{dt} M_{off} \quad [14]$$

$$= -\mu_0 N A M(0) \int \frac{1}{\tau_B(r_H)} e^{\frac{t}{\tau_B(r_H)}} f(r_H) dr_H$$

when the excitation field is off (zero magnetic field in the pulse train). There is slight field dependency in the Brownian relaxation time [2] but this can be neglected since the applied field is very small. This means that the Brownian relaxation time is equal both when the field is on and when the field is switched off.

By measuring the induced voltage, both when the field is on and when the field is switched off, it is possible to determine the hydrodynamic size distribution of the magnetic particle system very fast. This can be done in two ways: either the experimental data is fitted to equations 13 and 14 or a FFT (Fast Fourier Transformation) is performed on the experimental data (and the frequency dependent real and imaginary part of the complex susceptibility is obtained) and fitted as described above in the text. There is some ringing in the detection coil system due to the stray capacitance in the coil systems and the capacitive coupling between the excitation and detection coil system, but this does not give an exponential behaviour of the output signal from the detection coils, it is only the magnetic particle system that gives the exponential decrease. The ringing in the coil system can be electronically filtered or taken care of in the signal analysis.

An exemplary pulsed magnetic excitation field is illustrated in FIG. 3. Each pulse has an amplitude $H_0$ and a width, a. The FFT for the response to such excitation contains all the information available using the previously described response detection in the frequency domain.

The pulsed magnetic field can be characterised by the field amplitude, $H_0$, the width in time, a, when the field is on and the period time, T, of the pulses. The duty cycle of the pulse train, a/T, is chosen so that the exponential increase of the magnetization (when the field is on) and the exponential decay of the magnetization (when the field is switched off) can be fully seen in the detection time window, as is shown in FIG. 9, at least an amount large enough for conducting a relevant analysis. Too fast pulses yield only detection of a small part of the relaxation and to long pulses yield that the magnetization is constant or zero and gives detection of only noise and the signal to noise ratio is decreased. The optimum pulse train in this application have a duty cycle of, e.g. 50% and with a period time T equal to about $$T = 3\tau_B = 3 \frac{1}{2\pi f_B},$$

where $f_B$ is the frequency where the imaginary part of the dynamic susceptibility is maximum.

A typical coil can be represented by the equivalent circuit of FIG. 4. C is the parasitic capacitance between the turns of the insulated wires, L is coil inductance and R the resistance of the wire.

$\Delta V$ is the induced voltage in the detection coil system according to eq. 1, while V is the output voltage from the detection coil system. The output voltage can be described by:

$$V = \Delta V \frac{1}{1 - \omega^2 LC + j\omega RC} \quad [15]$$

$$= \mu_0 NAH_0\alpha(\chi'' + j\chi')\frac{\omega}{1-\omega^2 LC + j\omega RC}$$

from eq. 15 it can be seen that the sensitivity of the detection coil system can be increased if it is near or at the resonance frequency. The resonance frequency can be approximated by (for low values of R):

$$f_r = \frac{1}{2\pi\sqrt{LC}} \quad [16]$$

By using a tunable capacitance, $C_t$, coupled in parallel to C, illustrated in FIG. 5, the resonance frequency can be tuned to the measuring frequency and thereby increase the detection sensitivity. The total capacitance is then $C_t+C$ and shall replace C in eqs 15 and 16.

FIG. 6 illustrates a plot of sensitivity is increase (expressed as number times the ordinary sensitivity given by eq. 3) versus the frequency is plotted in the figure below for one specific case.

The real part and the imaginary part of the dynamic susceptibility change the inductance and the resistance according to:

$$L = L_0(1+\chi')$$

$$R = R_0 + 2\pi f L_0 \chi'' \quad [17]$$

where $L_0$ and $R_0$ is the inductance and resistance of the equivalent circuit without the sample. Since the values attained by the dynamic susceptibility are relative small in this application the inductance and resistance does not change too much. The resonant frequency does not change too much either and this variation can be neglected.

The FWHM of the resonance is determined mainly by R. It is well known that for a coil that is connected in parallel to the rest of the detection equipment the impedance at resonance, $Z_{res}$, attains its maximum value and can be much higher then the impedance far away from the resonance, $Z \ll Z_{res}$, as is shown in FIG. 6. As discussed above, the resonance frequency of a coil can be tuned using an additional capacitance in parallel with the coil as in FIG. 5.

WO 03/019188 describes the procedure of sweeping the frequency of the external magnetic field that is created by the excitation coil and detected the response of the system under investigation differentially, using a system of two suitably wounded detection coils. Each detection coil is chosen to be as close to the other one as possible to decrease the off-set voltage (current) that is necessarily created by the electrical mismatch of the two coils, connected in parallel (series) to the rest of the system. Furthermore, each coil is designed so that its resonance frequency is far away from the maximum frequency corresponding to the response of investigated system. This has been considered advantageous since the further each coil was from its resonance frequency the smaller was the change in its voltage (current) measured at slightly different frequencies. The result is however that a system induced voltage (current) excursions is very low (for a magnetic particle system with low susceptibility).

In order to increase the available signal and simultaneously keep the differences in coil responses with changed frequency at minimum, it is instead possible to adjust the resonant frequency of each coil to a measuring frequency. Thus, it is possible to adjust the resonant frequency of each coil to a value at which a measurement of the system response would be performed and then change the resonant frequency and perform the measurement at the new frequency, and so on. This would of course increase the signal available at the coil terminals and therefore increase the S/N ratio. This adjustment can be made using an additional capacitance, $C_t$ in parallel with the coil, as in FIG. 5. Preferably the frequency change should occur after the measurement has been performed. A suitable (but not only) parameter that may be chosen to signal the end of measurement is when measurement at a given frequency has attained a preset S/N ratio. Once the preset ratio has been attained the system should sent a signal that would initiate the change in coil resonant frequency by changing the extra, variable, capacitance, $C_{tune}$, and a new measurement at a new frequency can start.

Note that the capacitance in series with the coil will not allow to tune the frequency too much since the resonant frequency is then given by $$f_r = \frac{1}{2\pi\sqrt{LC}}\sqrt{\frac{1}{1+\frac{C}{C_t}}}$$

It is well known that particles dispersed in a solvent may aggregate. Particle aggregation models able to describe rather accurately a variety of experimental conditions have been set up and solved. Although the kinetics of aggregation has been described for many practical cases it is still an active field of investigation, in particularly regarding the interaction of soft and non-spherical particles like proteins, or interaction of rigid particles of sizes where the sedimentation also occurs, both for flowing and for the still solvent, respectively.

All these studies have established that there is a direct link between the particle concentration and cluster growth rate, although this link is often given by a complicated functional equation or form and is often non-linear.

As an example consider binary collisions of particles whose motion are predominantly Brownian, having diameter (typically) <3 µm.

The rate of decrease of the number of particles/volume from its initial value, $n_0$ (at t=0) is governed by:

$$-\frac{dn}{dt} = kn^2 \quad [18]$$

where n is number of particles/liter while k is the aggregation rate constant. Here it is assumed that the already formed clusters are stable on the time scale of the experiment. The rate constant k contains information on the stability of the clusters as well as on their mobility and on the probability of reaction given two particles, two clusters, or a cluster and a particle, collide. The solution to eq. 15 is given by $$n(t) = \frac{n_0}{1+n_0 kt},$$

which shows initially the number of formed particles decreases linearly with the initial number of particles. Since cluster mobility depends on the cluster size the rate of collisions decrease rapidly with cluster sizes and mirrors mainly the collisions between the smallest clusters, i.e., the initial particles. This means that after time t the particle size increased while their number decrease, $n<n_0$, but that the clusters formed are made predominantly from two initial particles (particle-cluster and cluster-cluster collisions are rare compared to particle-particle collisions).

At any rate when applying aggregation to the case of magnetic nano-particles, it is found that the relaxation time increases rapidly during the aggregation (since it depends on the hydrodynamic volume and thus grows as fast or faster then the particle volume grows. The reason is that hydrodynamic volume is given by the particle-solvent interaction. The latter depends, among many other things, on surface roughness which increases with the cluster size. Therefore as agglomeration proceeds the dynamic magnetic susceptibility appears at lower and lower frequencies, e.g. less than 1 Hz, and eventually disappears from the measurement window when the measurements are performed in frequency domain as described in WO 03/019188. When measurements are performed in time domain there is an increasing time lag with respect to the external magnetic field (the excitation field) as cluster size increases when particle respond to a pulse train.

Since it is much easier to monitor signal disappearance or discriminate between time-varying signals vs. the constant one the monitoring of agglomeration rate is more sensitive than ordinary detection.

On the other hand if one does want to monitor the agglomeration kinetics the appropriate choose is to perform measurement in the time domains since one is able to detect relaxation times much longer then the equivalent frequencies in the frequency domain. Typically the lower limit of measurements in the frequency domain is approximately 1 Hz which is equivalent to a relaxation time of 1 sec. However by measuring in the time domain it is relatively easy to detect relaxation times >10 sec.

In the following, few applications are described where clustering rate may be tailored to correspond to a number (or concentration) of molecules of interest in a solution. The description starts from a general situation and then procedures are exemplified by few specific examples. Referring to FIG. 7, consider a particle 750 with some analyte 752 adsorbed to its surface. The target molecules are denoted 753.

Clustering may occur if the analyte bound to the particle can form dimers (multimeres) and these additional bonds are exposed towards the outside. The particles may form cluster with a cluster formation rate that depends on the analyte coverage.

Assume that the molecules to be detected form multiple bonds 755 with the analyte adsorbed to the particles. If particles with the adsorbed analyte are added to a solution containing an unknown concentration of such target molecules then clusters will be formed where the particles are held together with each other by the bonds mediated via the target molecule. The cluster formation rate is in such case a function of the concentration of target molecules in solution.

Yet another situation may arise if the molecules aimed to be detected bind to different analytes 756 with their different parts. In that case, particles covered by different or similar concentration of such analytes are added to a solution containing target molecules. The agglomeration rate will again be dependent from the concentration of target molecules.

In all these cases the signal does not only depend on the target molecule but also on the concentration of particles in solution and on their size and analyte coverage (among other things). This is actually of value since it allows (among other things) to adjust to some extent the decrease rate and/or the response amplitudes to levels manageable by the measuring equipment used.

In the following, specific examples are given for few of the general cases depicted in FIG. 7.

Example 1

Consider particles covered with biotin added to a solution with (strept-, neutro-, etc.) avidin. Since these molecules each have multiple biotin binding sites it is possible to determine their amount in solution by monitoring the agglomeration rate.

Example 2

Consider particles that are covered with (strept-, neutro-, etc.) avidin. If the target molecule is able to form multiple bonds with biotin and these target molecules with multiply bound biotins are exposed to avidin covered particles it is very probable that particle clustering will occur.

Example 3

Assume that the concentration of a known DNA sequence is required that is characteristic of for example TBC or HIV or other bacterias, cells, etc. It is possible then to extract DNA from the cell or micro-organism, cut into suitable sequence lengths and amplify it. Then it is possible to add to the solution containing the target DNA strands particles covered with suitable complementary single strands, split the double target strands into a single ones and allow the strands on the particles to hybridise with the target strands in solution.

It is possible to monitor hydrodynamic volume changes either in the time domain or in the frequency domain.

If however the cut DNA pieces are long enough to be able to hybridize to the two different DNA single strands on the particles then the clustering will occur. In this case, it is possible to monitor the agglomeration in the time domain. The agglomeration rate will be a measure of the concentration of such long DNA strands in solution.

Example 4

Virtually any antibody based diagnostic procedures require two antibodies: one which catches the target antigen and the second one suitably modified to allow detection that is adsorbed to the catching antibody-antigen complexes. Similar assay can be performed using magnetic nano particles covered with catching antibody and with the detection antibody, respectively. To a solution containing the target antigen, nano particles covered with each kind of antibody are added. The clustering will occur since antigen will be able to form bonds with each type of antibody and thus will hold together particles of each kind.

Example 5

It is also possible to allow particles covered with suitable protein that binds specifically to membrane bound proteins of a virus, a cell or a micro-organism (or to their lipopolysaccharide strands) to interact with the object. The particles will then bind to this object and are lost from the detection window if an object they bind to is large, i.e. its Brownian motion is slow.

Another example of the systems 800a and 800b for sample arrangement is shown in FIGS. 8a and 8b. A capillary 840a and 840b is used as a sample 840 holder and a fluidic flow system to deliver the sample to the detection area. The sample is injected into a flow as a "plug" 840 of certain width that is determined by the injection time and speed. The flow is regulated (e.g. by a flow regulator 842) so that the plug can be stopped at a desired position, for example at the measuring positions 850*a*, 850*b* and 860*a*, 860*b*. It is also possible to anticipate using several plugs of the same or different materials created by successive injections.

FIG. 8*a* shows that different positions/geometries inside the detection coil(s) 810 and 820 are possible while the sample and capillary arrangements in FIG. 8*b* are similar to aforementioned embodiment The plug width, w, as well as the distance between the coil(s) $l_{coil}$ can be varied so that the part of the sample where the measurement is performed is homogeneous and is not subject to intermixing with the rest of the fluid. This is possible given the plug flows under laminar flow since the mixing is then due only to diffusion and is relatively slow.

Preferably, the measurement system is calibrated by a two-step routine. In the first step, the system response is measured with an empty sample holder. The effect this measurement picks up is the difference in signal when the empty sample holder is in the upper coil to when the sample holder is in the lower coil. The difference is attributed to the dielectric properties of the sample holder and the mechanical arm moving the sample holder. The resulting (complex) voltage, $V_b = V_b^{Re} + j*V_b^{Im}$, is a background signal which is subtracted from any measured signal in the subsequent measurements. The second step is performed with a sample containing a material with a known and preferably frequency independent magnetic susceptibility, for instance a paramagnetic material such as $Dy_2O_3$. The calibration materials are chosen preferably to have a frequency independent susceptibility in the frequency range used in our sensor system. The value of the susceptibility of the calibration material should preferably be in the same range as for the measured sample. The geometry and dimensions of the calibration sample should preferably be the same as for the measurement samples, in order to get the correct coupling factor in the detection coil(s). The measured voltage minus the background gives the (complex) voltage-to-susceptibility transfer factor, $G = X_{cal}/(V_{cal} - V_b)$.

The frequency dependency of the gain and the phase between the applied excitation field and the magnetic response from the detection coil(s) is a major concern in construction a high bandwidth susceptometer. The frequency dependency of the gain and the phase becomes strong at high frequencies, especially at frequencies close to the resonance frequency of the detection coil(s) or the excitation coil. The gain and phase can also become frequency dependent due to the properties of the excitation electronics and/or the detection electronics. The measured sample data will become incorrect, especially at high frequencies, if these effects are not compensated for.

The frequency dependency of the gain and the phase shift are compensated by means of a routine similar to the calibration described above. The difference is that the two calibration steps at many different frequencies are performed. Hence, the result is a frequency dependent background (complex) voltage $V_b(f)$ and a (complex) frequency dependent voltage-to-susceptibility transfer factor, $G(f) = X_{cal}(f)/(V_{cal}(f) - V_b(f))$. Using a frequency independent reference sample (a sample with a constant $X_{cal}$) simplifies the second step in the compensation routine.

The invention is not limited to the described and illustrated embodiments and the teachings of the invention can be varied in a number of ways without departure from the scope of the invention as claimed in the attached claims.

The invention claimed is:

1. A device for detecting a magnetic field response or changes in a magnetic response of at least one magnetic particle in a carrier fluid, said detection comprising measuring said magnetic particles characteristic rotation period, and said measurement involving measurement of a Brownian relaxation in said carrier fluid under influence of an external pulsed magnetic field, said device comprising means for generating said pulsed magnetic field, at least two substantially identical detection coils connected in gradiometer coupling to detection electronics for measuring differential induced voltage which is dependent on the frequency dependent susceptibility or the magnetization change, wherein the differential induced voltage is $$\Delta V = N \frac{d}{dt}(\Phi_1 - \Phi_2)$$
$$= \mu_0 N A \alpha \frac{d}{dt}(H + M - H)$$
$$= \mu_0 N A \alpha \frac{d}{dt} M$$

wherein N is a number of turns in two identical detection coils, A is the cross sectional area in the detection coils, H the magnetic field produced by an excitation coil, α a magnetic coupling factor and M is a magnetization of the particle system.

2. The device of claim 1, comprising a detection coil system comprising said two substantially identical detection coils which include a first detection coil and a second detection coil, the excitation coil and a sample holder, wherein said differential induced voltage is dependent on the detection coils' number of (N) turns or physical characteristics.

3. The device of claim 1, wherein the excitation coil is wound as a solenoid with a specific length, diameter and number of turns of the winding.

4. The device of claim 3, comprising additional shim coils at top and bottom of the solenoid in order to generate a more homogenous magnetic field in the excitation coil.

5. The device of claim 1, comprising a detection coil system is arranged in a form of a first order gradiometer coupling placed in the center of the excitation coil.

6. The device of claim 1, comprising a detection coil system including at least two substantially identical detection coils arranged as two well matched coils coupled together.

7. The device of claim 1, comprising a detection coil system for detecting a rate of a magnetic flux difference between the at least two substantially identical detection coils.

8. The device of claim 1, comprising a detection coil system formed by positioning said at least two substantially identical detection coils as two matched coils with their length axis substantially parallel to a length axis of the excitation coil.

9. The device of claim 1, comprising a detection coil system formed by positioning said at least two substantially identical detection coils as two matched coils with their length axis substantially parallel to a length axis of the excitation coil wherein said two detection coils have a specific length, diameter and a number of turns of the wirings and excitation coils gives a signal strength from the detection coil system.

10. The device of claim 1, wherein the detection coils are wound either:

in two different directions, clockwise and counterclockwise and coupled in series, or in the same directions but coupled together so that the induced voltages in the two coils are in the opposite direction.

11. The device according to claim 1, wherein said external pulsed magnetic field is applied over said magnetic particles, and a magnetization of the particles is measured in time domain either by measuring the increase of magnetisation immediately after application of a pulse or by measuring the decay of magnetisation after the pulse has been switched off.

12. The device according to claim 1, wherein said pulsed magnetic field is applied over said magnetic particles, and a magnetization of the particles increases when the field is applied and decrease exponentially when the field is removed; where the exponential behaviour is characteristic of relaxation time which is proportional to the inverse of the Brownian relaxation frequency.

13. The device according to claim 1, wherein a hydrodynamic size distribution of the magnetic particle system is determined by measuring said differential induced voltage, both when the field is on and when the field is switched off.

14. The device according to claim 13, wherein a duty cycle of a pulse train (a/T) is chosen so that an exponential increase of the magnetization, when the field is on, and an exponential decay of the magnetization, when the field is switched off, is fully detected in the detection time window.

15. The device according to claim 1, wherein a resonant frequency of each coil is adjusted to a measuring frequency.

16. The device according to claim 1, comprising a capillary as a sample holder and a fluidic flow system to deliver the sample to a detection area.

* * * * *